United States Patent
Ahmed et al.

(10) Patent No.: US 9,437,674 B2
(45) Date of Patent: Sep. 6, 2016

(54) INSULATING TRENCH FORMING METHOD

(71) Applicant: STMicroelectronics (Crolles 2) SAS, Crolles (FR)

(72) Inventors: Nayera Ahmed, Crolles (FR); François Roy, Seyssins (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 14/660,601

(22) Filed: Mar. 17, 2015

(65) Prior Publication Data
US 2015/0295030 A1 Oct. 15, 2015

(30) Foreign Application Priority Data

Apr. 11, 2014 (FR) ...................................... 14 53230

(51) Int. Cl.
*H01L 29/06* (2006.01)
*H01L 21/762* (2006.01)
*H01L 21/763* (2006.01)

(52) U.S. Cl.
CPC ......... *H01L 29/0649* (2013.01); *H01L 21/763* (2013.01); *H01L 21/76202* (2013.01); *H01L 21/76205* (2013.01); *H01L 21/76224* (2013.01); *H01L 21/76227* (2013.01); *H01L 21/76229* (2013.01)

(58) Field of Classification Search
CPC ..................... H01L 29/0649; H01L 21/76224
See application file for complete search history.

(56) References Cited

U.S. PATENT DOCUMENTS

| | | | |
|---|---|---|---|
| 5,059,550 A | 10/1991 | Tateoka et al. | |
| 9,024,240 B2 | 5/2015 | Roy et al. | |
| 2001/0003660 A1 | 6/2001 | Kotani et al. | |
| 2005/0236664 A1* | 10/2005 | Aoki | 257/330 |
| 2015/0333127 A1* | 11/2015 | Morino | H01L 29/1608 |
| 2015/0380537 A1* | 12/2015 | Kato | H01L 29/7397 |

FOREIGN PATENT DOCUMENTS

EP 0 926 728 A1 6/1999

* cited by examiner

*Primary Examiner* — Marc Armand
(74) *Attorney, Agent, or Firm* — Seed IP Law Group PLLC

(57) ABSTRACT

A method of manufacturing an insulating trench including the successive steps of: a) forming, on a semiconductor substrate, a first masking structure including a layer of a first selectively-etchable material and etching a trench into the substrate; b) forming an insulating coating on the trench walls and filling the trench with doped polysilicon; c) forming a silicon oxide plug penetrating into the trench substantially all the way to the upper surface of the substrate and protruding above the upper surface of the substrate; and d) removing the layer of the first material.

26 Claims, 4 Drawing Sheets

(Known Art)

INSULATING TRENCH FORMING METHOD

BACKGROUND

1. Technical Field

The present disclosure relates to the forming of insulating trenches. More particularly, the present disclosure relates to the forming of insulated trenches filled with a conductive material.

2. Description of the Related Art

Electronic components, and in particular pixels, formed in a semiconductor substrate are generally separated from one another by insulating structures. A type of insulating structure comprises a trench having its walls covered with an insulating coating, the trench being filled with a conductive material.

FIG. 1 is a simplified cross-section view showing an example of a device comprising such insulating trenches and a transistor extending between two trenches. Two trenches 1 are formed in a semiconductor substrate 3. The walls of each trench are covered with an insulating coating 5. Each trench is filled with a conductive material 7 having an upper portion 9 protruding above the upper surface of substrate 3. In operation, a fixed bias voltage is applied to conductive material 7 of the trench.

A transistor for which only the gate has been shown is formed between the two trenches. Conductive gate 11 covers a portion of a gate insulator layer 13. The gate extends between the two trenches 1, each end of the gate being arranged above upper portion 9 of conductive material 7 of a trench 1. In operation, gate 11 is alternately set to a high voltage and to a low voltage.

At the level of an upper portion 9 of conductive material 7, gate 11 is separated from conductive material 7 by insulating layer 13 having a thickness generally lower than 10 nm. There thus is a strong stray capacitance between gate 11 and conductive material 7.

Further, due to the small thickness of gate insulator layer 13 and to the topography of upper portion 9 of conductive material 7 of each trench 1, cracks may appear in gate insulator layer 13, more particularly at the upper corners of portion 9. Such cracks in gate insulator layer 13 may cause short-circuits between gate 11 and conductive material 7.

It would be desirable to provide a structure avoiding such disadvantages.

There further exist devices comprising deep insulation trenches, currently called DTI (Deep Trench Insulation) trenches and shallower trenches currently called STI (Shallow Trench Insulation) trenches. DTI trenches, for example the trenches of FIG. 1, generally penetrate by more than 2 µm into the substrate and STI trenches generally penetrate by less than 1 µm into the substrate, STI trenches being filled with an insulating material, for example, silicon oxide.

In such devices, it is desirable, particularly for the implementation of photolithography methods, for the upper surfaces of the materials filling the various trenches to be at the same level.

BRIEF SUMMARY

Thus, an embodiment provides a method of manufacturing an insulating trench comprising the successive steps of: a) forming, on a semiconductor substrate, a first masking structure comprising a layer of a first selectively-etchable material and etching a trench into the substrate; b) forming an insulating coating on the trench walls and filling the trench with doped polysilicon; c) forming a silicon oxide plug penetrating into the trench substantially all the way to the upper surface of the substrate and protruding above the upper surface of the substrate; and d) removing the layer of the first material.

According to an embodiment, the oxide plug penetrates into the trench such that a portion of the plug is under the upper surface of the substrate.

According to an embodiment, step c) comprises the successive steps of: c1) selectively etching the polysilicon so that an upper portion of the polysilicon reaches an intermediate level of the thickness of the layer of the first material; and c2) performing a thermal oxidation to form said oxide plug from said upper portion.

According to an embodiment, step c) comprises the successive steps of: c3) selectively etching the polysilicon substantially all the way to the upper surface of the substrate; c4) depositing silicon oxide so that, above the upper surface of the polysilicon, the silicon oxide reaches at least the upper surface of the layer of the first material; and c5) planarizing the upper surface of the structure all the way to the layer of the first material.

According to an embodiment, the first material is silicon nitride.

According to an embodiment, the method further comprises, between steps c) and d), the successive steps of: e) forming a second masking structure; f) etching a shallower trench into the layer of the first material and into the substrate; g) depositing a second insulating material to fill said shallower trench; and h) planarizing the upper surface of the structure all the way to the level of said oxide plug.

According to an embodiment, the method further comprises, after step d), the successive steps of: i) exposing the upper surface of the substrate; j) depositing a gate insulator layer, followed by layers of a conductive gate stack, on the exposed surface of the structure; and k) masking and etching to leave the gate in place.

According to an embodiment, the insulating coating comprises a thermal silicon oxide layer, a deposited silicon oxide layer, and a silicon nitride layer.

According to an embodiment, the filling of the trench at step b) is performed by deposition of a doped polysilicon layer on the exposed surface of the structure.

According to an embodiment, the deposition of the doped polysilicon layer is followed by a step of planarizing the upper surface of the structure all the way to the layer of the first material.

According to an embodiment, said second insulating material is silicon oxide.

An embodiment provides an insulating structure formed in a semiconductor substrate, the insulating structure comprising: a trench penetrating into the substrate; an insulating coating covering the trench walls; doped polysilicon filling the trench; and a silicon oxide plug formed at the top of the polysilicon, the upper surface of the oxide plug protruding above the substrate and the lower surface of the plug being substantially at the level of the upper surface of the substrate.

According to an embodiment, the lower surface of the plug is under the upper surface of the substrate.

According to an embodiment, the trench penetrates into the substrate down to a depth greater than 2 µm.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the various drawings and the various drawings are not to scale.

DETAILED DESCRIPTION

In the present disclosure, when two surfaces are described as being substantially at the same level, it should be understood that the two surfaces are at the same level to within 5 nm.

FIGS. 2A to 2E are simplified cross-section views illustrating an embodiment of successive steps of a method of manufacturing insulated trenches filled with polysilicon.

Figure 2A:
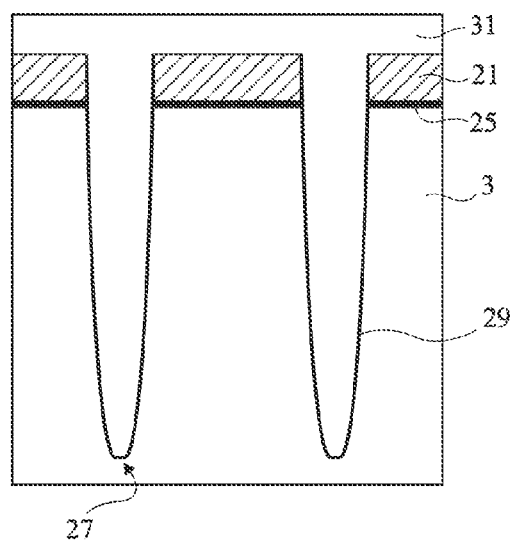
FIGS. 2A to 2E are simplified cross-section views illustrating an embodiment of successive DTI trench manufacturing steps.

FIG. 2A shows a semiconductor substrate 3 coated with a masking layer 21. Masking layer 21—or hard mask—for example is a silicon nitride layer deposited on a silicon oxide layer 25. Openings have been formed by photolithography in masking layer 21 and two trenches 27 have been etched all the way into substrate 3. After the forming of trenches 27, the walls of these trenches are insulated by forming an insulating coating 29 on the walls. This insulation step is followed by the deposition of a doped polysilicon layer 31 on the exposed surface of the structure to fill polysilicon trenches 31.

As an example, substrate 3 is made of single-crystal silicon. Silicon oxide layer 25 may be formed by thermal oxidation of the upper surface of the substrate and may have a thickness in the range from 5 to 20 nm, for example, 7 nm. Masking layer 21 may be deposited by chemical vapor deposition, and the thickness of this layer may be in the range from 25 to 200 nm, for example, 100 nm. Trenches 27 are formed by anisotropic etch methods generally comprising plasma etchings adapted to the various materials to be etched. The insulating coating comprises one or a plurality of insulating layers. For example, insulating coating 29 successively comprises, from the outside to the inside of a trench, a silicon oxide layer formed by thermal oxidation, a silicon oxide layer formed by chemical vapor deposition, and a silicon nitride layer formed by chemical vapor deposition.

Figure 2B:
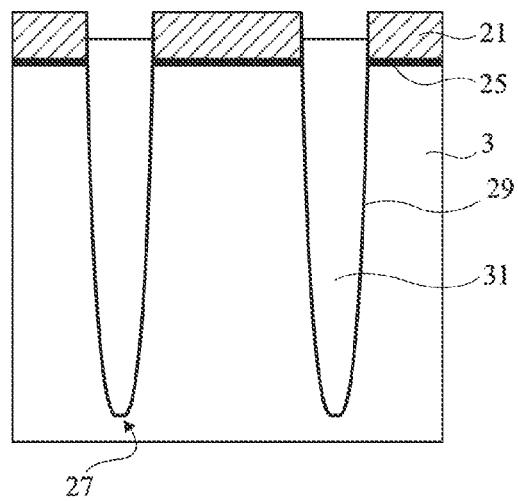

As illustrated in FIG. 2B, all that has been formed or deposited on masking layer 21 is removed. Such a removal may be for example performed by a chemical-mechanical polishing (CMP) stopping on masking layer 21. After this, a selective etching of polysilicon 31 is carried out until the upper surface or top of the polysilicon filling trenches 27 is at an intermediate level between the upper and lower surfaces of masking layer 21, for example, at the level of half the thickness of layer 21. As an example, the upper surface of the polysilicon is arranged 30 nm above the upper surface of the substrate for an oxide layer 25 having a 7-nm thickness and a masking layer 21 having a 100-nm thickness.

Figure 2C:
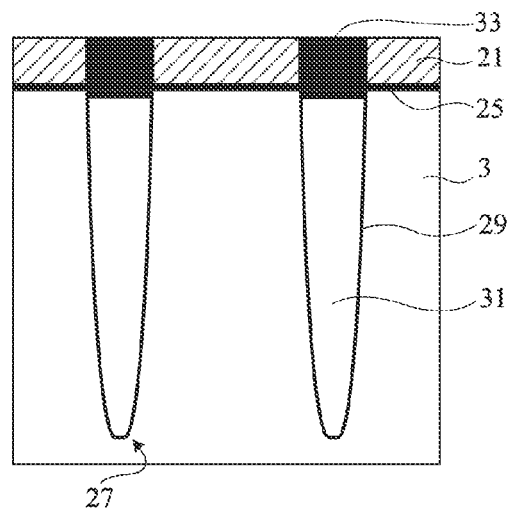

After this, as illustrated in FIG. 2C, an oxide plug 33 is formed from an upper portion of polysilicon 31. Oxide plug 33 is formed by thermal oxidation. The conditions of the thermal oxidation are selected so that the lower surface of oxide plug 33 is substantially at the level of the upper surface of substrate 3, preferably under the upper surface of the substrate. As an example, the thickness of oxide plug 33 is in the range from 50 to 80 nm, for example, 70 nm.

Figure 2D:
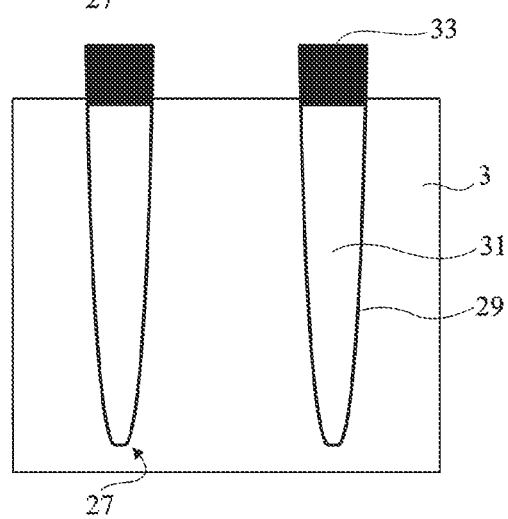

FIG. 2D shows the structure of FIG. 2C after selective removal of masking layer 21 and of oxide layer 25.

Figure 2E:
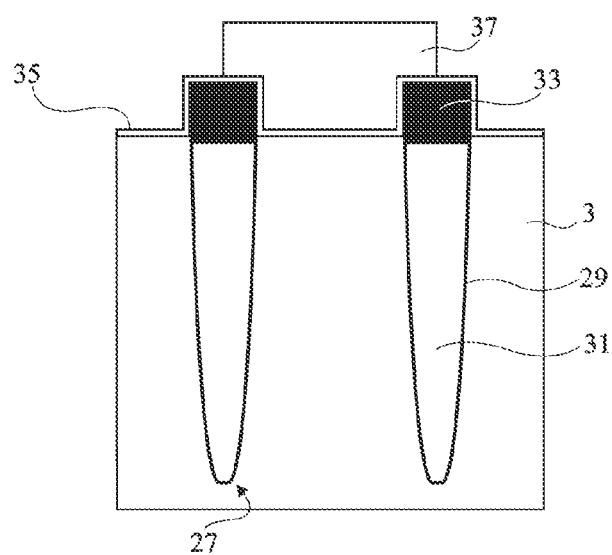

It is then possible, as illustrated in FIG. 2E, to form a gate insulator layer 35, followed by conductive layers, on the exposed surface of the structure shown in FIG. 2D, masking and etch steps enabling to leave in place a portion of the conductive layers to form a gate 37. Gate 37 extends between trenches 27, each end of gate 37 being arranged above an oxide plug 33 of a trench 27. As an example, gate insulator layer 35 is a silicon oxide layer for example formed by chemical vapor deposition. The thickness of gate insulator layer 35 may be in the range from 3 to 10 nm, for example, 5 nm.

Figure 1:
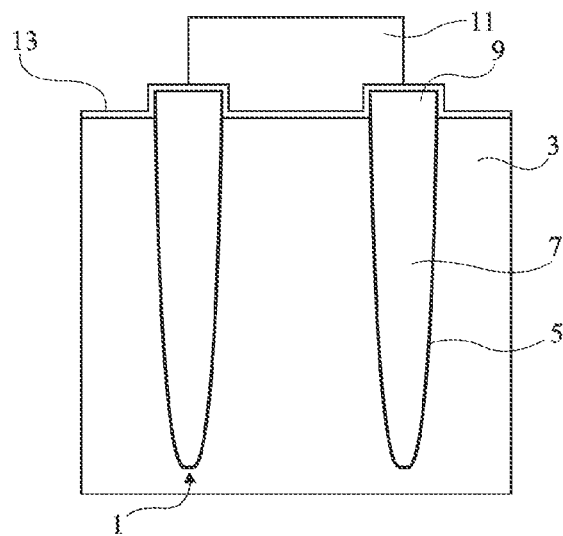
FIG. 1, previously described, is a cross-section view schematically showing a transistor formed between two DTI trenches.

Due to the presence of the oxide plug, there is a significant thickness of thermal oxide 33 between gate 37 and polysilicon 31 filling trenches 27. The stray capacitance between polysilicon 31 and gate 37 is thus strongly decreased with respect to the case of FIG. 1 where oxide plugs 33 do not exist. Further, oxide plugs 33 enable to suppress the risk of short-circuit between the conductive material, here, doped polysilicon 31, and conductive gate 37, caused by possible cracks of the gate insulator at the upper corners of the oxide plugs.

Figure 3A:
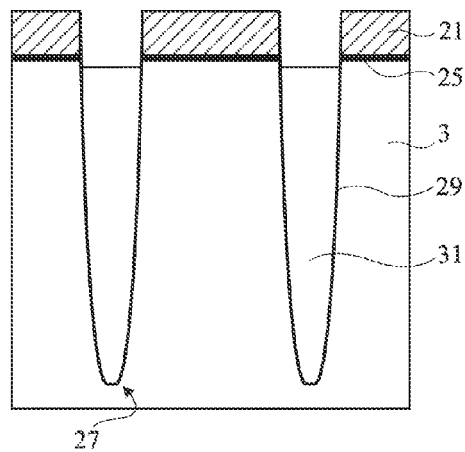
FIGS. 3A and 3B are simplified cross-section views illustrating an alternative embodiment of successive DTI trench manufacturing steps.
Figure 3B:
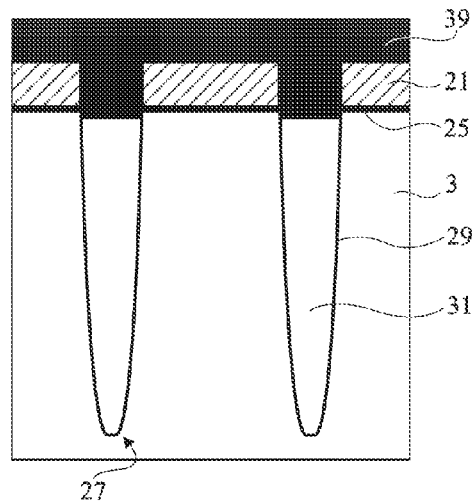

FIGS. 3A and 3B illustrate a variation of the steps of the manufacturing of oxide plug 33 formed at the top of a DTI trench 27.

FIG. 3A shows a structure similar to that of FIG. 2A, with the difference that polysilicon 31 has been preferably etched substantially all the way to the upper surface of substrate 3, preferably under the upper surface of the substrate. As illustrated in FIG. 3B, this step of selectively etching the polysilicon is followed by the deposition of a silicon oxide layer 39 on the exposed surface of the structure, for example, by chemical vapor deposition. The thickness of silicon oxide layer 39 is selected so that silicon oxide layer 39 formed above polysilicon 31 reaches at least the upper surface of masking layer 21.

The structure shown in FIG. 2C is then obtained by removing silicon oxide 39 formed above masking layer 21, for example, by CMP stopping on masking layer 21, so that there remains an oxide plug 33 having its upper surface above the upper surface of substrate 3 and having its lower surface substantially at the level of the upper surface of the substrate, preferably under the upper surface of the substrate.

FIGS. 4A to 4E are simplified cross-section views illustrating steps enabling to simultaneously manufacture STI and DTI trenches. In these drawings, the same elements as those described in relation with FIGS. 2A to 2E are designated with the same reference numerals.

Figure 4A:
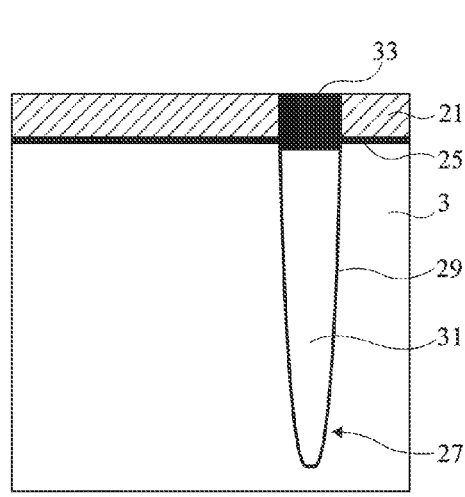
FIGS. 4A to 4E are simplified cross-section views illustrating an embodiment of successive DTI and STI trench manufacturing steps.

FIG. 4A shows a DTI insulated trench 27 in a substrate 3 at the step described in relation with FIG. 2C, that is, after having formed an oxide plug 33 above the top of polysilicon 31 filling the trench.

Figure 4B:
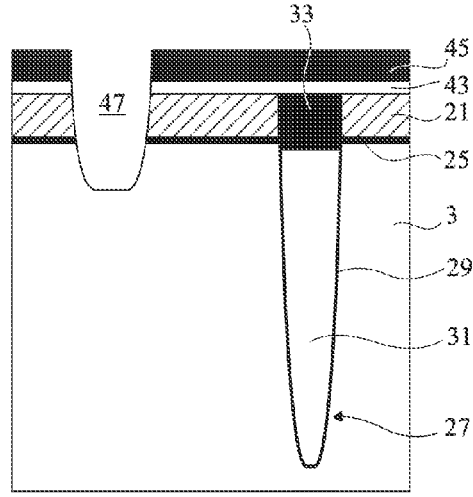

FIG. 4B shows the structure of FIG. 4A coated with a silicon oxide layer 43 topped with a photosensitive layer 45, for example, a resin layer. An STI-type trench 47, shallower than trench 27, has been etched by photolithography through layers 45, 43, 21, and 25, and penetrates into substrate 3.

Oxide layer 43 is for example formed by chemical vapor deposition using a precursor such as TEOS (tetraethylorthosilicate). The thickness of oxide layer 43 may be in the range from 25 to 75 nm, for example, 50 nm. Trench 47 penetrates into the substrate down to a depth which may be in the range from 0.1 to 1 μm, for example, 0.3 μm.

Figure 4C:
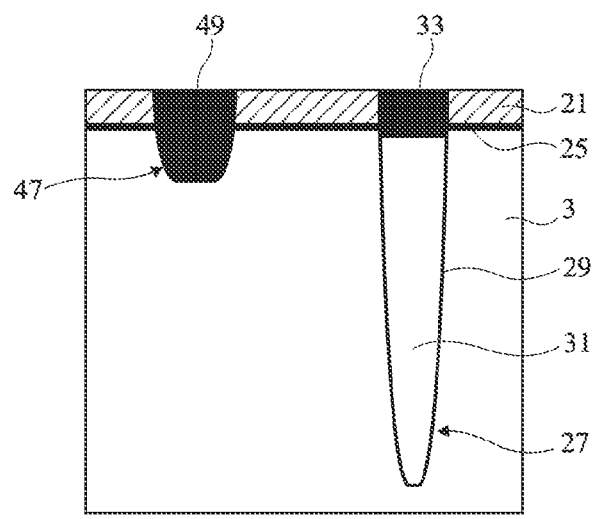

FIG. 4C shows the structure of FIG. 4B after deposition of a layer of an insulating material 49 to fill STI trench 47. This filling step is followed by a planarization of the structure all the way to the upper surface of oxide plug 33. The planarization step performed by CMP enables to place the upper surface of insulating material 49 filling trench 47 at the level of the upper surface of oxide plug 33 of trench 27. As an example, insulating material 49 is silicon oxide formed, for example, by chemical vapor deposition.

Figure 4D:
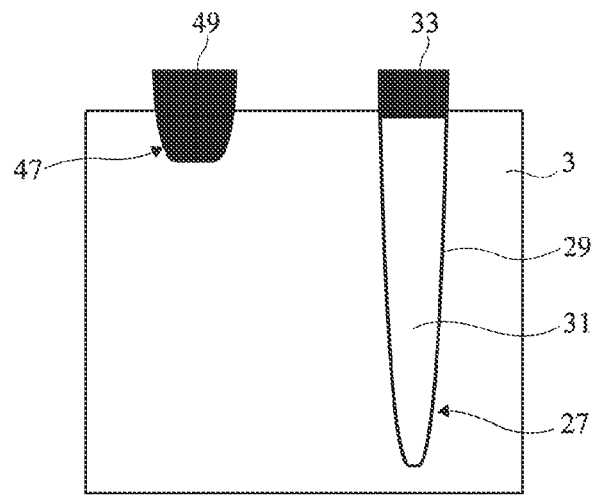

FIG. 4D shows the structure of FIG. 4C after etching of masking layer 21 and silicon oxide layer 25. After this step, oxide plug 33 and insulating material 49 protrude above substrate 3 by a same height which may be in the range from 5 to 50 nm, for example, 25 nm.

Figure 4E:
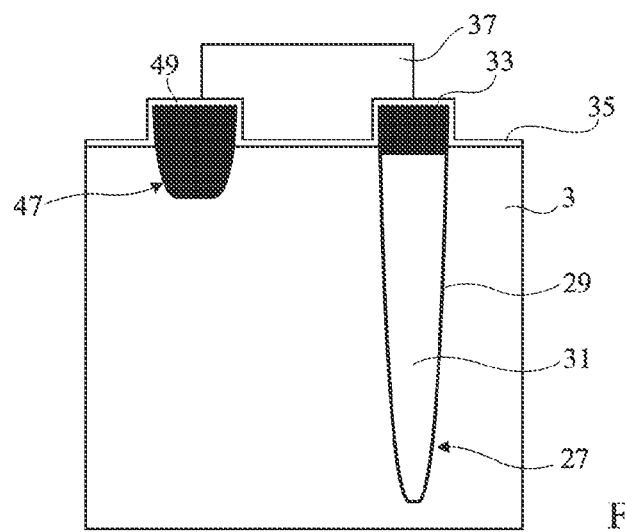

FIG. 4E shows the structure of FIG. 4D after deposition of a gate insulator layer 35 and of conductive layers, masking and etch steps enabling to leave in place a portion of the conductive layers to form a gate 37. The gate extends between DTI trench 27 and STI trench 47 and comprises an end arranged on oxide plug 33 of DTI trench 27 and an end arranged on insulating material 49 of STI trench 47.

The method described in relation with FIGS. 4A to 4E enables the upper surfaces of oxide plug 33 of a DTI trench 27 and of insulator 49 of an STI trench 47 to be at the same level.

Further, DTI trenches 27 may be formed before STI trenches 47, when the silicon oxide of plug 33 is formed by thermal oxidation as described in relation with FIG. 2C. This manufacturing method enables to avoid for oxide 49 of an STI trench to extend during the thermal oxidation.

Specific embodiments have been described. Various alterations, modifications, and improvements will readily occur to those skilled in the art. In particular, although an insulating coating 29 comprising a thermal silicon oxide layer, a deposited oxide layer, and a nitride layer, has been described in relation with FIG. 2A, other layers made of other insulating materials may be used to form insulating coating 29.

Further, although the method has been described in the context of a solid single-crystal silicon substrate, other semiconductor materials, for example, silicon-germanium, or other substrates, for example, SOI-type substrates, may be used.

Other materials than silicon nitride may be selected for masking layer 21. These other materials will be selected to be selectively etchable over silicon oxide and so that the polysilicon is selectively etchable over these materials. More generally, the thicknesses and the materials of the various layers previously indicated as an example may be adapted by those skilled in the art.

The manufacturing method described in relation with FIGS. 2A to 2E, 3A, 3B, and 4A to 4E may be adapted by those skilled in the art. In particular, steps may be added, suppressed, or modified. For example, a doped area may be formed by implantation along the external walls of a trench 27 before the trench is filled with polysilicon.

Such alterations, modifications, and improvements are intended to be part of this disclosure, and are intended to be within the spirit and the scope of the present disclosure. Accordingly, the foregoing description is by way of example only and is not intended to be limiting. The present disclosure is limited only as defined in the following claims and the equivalents thereto.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method of manufacturing an insulating trench, the method comprising:
    forming a trench having trench walls in a surface of a substrate;
    covering the trench walls with an insulating material;
    filling the trench with doped polysilicon; and
    forming a silicon oxide plug over the polysilicon, an upper surface of the silicon oxide plug located above the surface of the substrate and a lower surface of the silicon oxide plug being substantially at or below the surface of the substrate; and
    forming an insulator layer on the surface of the substrate and the upper surface of the silicon oxide plug.

2. The method of claim 1, wherein the lower surface of the silicon oxide plug is below the surface of the substrate.

3. The method of claim 1, wherein forming the silicon oxide plug comprises:
    selectively etching the polysilicon; and
    performing a thermal oxidation to form said oxide plug.

4. The method of claim 1, wherein forming the silicon oxide plug comprises:
    selectively etching the polysilicon;
    depositing silicon oxide over the polysilicon; and
    planarizing the silicon oxide.

5. The method of claim 1, further comprising:
    forming, on the surface of the substrate, a first masking structure having a layer of a selectively etchable first material, the first material being silicon nitride.

6. The method of claim 1, wherein the trench is a first trench, and after forming the silicon oxide plug, the method further comprising
    forming a second trench in the surface of the substrate, the second trench having a smaller depth than the first trench;
    depositing a second insulating material to fill said second trench; and
    planarizing exposed surface to a same level of said oxide plug.

7. The method of claim 6, wherein said second insulating material is silicon oxide.

8. The method of claim 1, further comprising:
    depositing, on the insulator layer, at least one layer of a conductive gate stack; and
    masking and etching the at least one layer of the conductive gate stack to form a gate.

9. The method of claim 1, wherein the covering of the trench walls with the insulating material includes forming a thermal silicon oxide layer, a silicon oxide layer, and a silicon nitride layer.

10. The method of claim 1, wherein the filling of the trench includes depositing a doped polysilicon layer in the trench and over the surface of the substrate.

11. The method of claim 10, wherein the depositing of the doped polysilicon layer is followed by planarizing the doped polysilicon layer.

12. An insulating structure formed in a semiconductor substrate, the insulating structure comprising:
   a trench having trench walls formed in a first surface of the substrate;
   an insulating material covering the trench walls;
   doped polysilicon in the trench; and
   a silicon oxide plug formed over the polysilicon, an upper surface of the silicon oxide plug located above the first surface of the substrate, and a lower surface of the silicon oxide plug being below the first surface of the substrate and in the trench.

13. The insulating structure of claim 12, wherein the lower surface of the silicon oxide plug is below the surface of the substrate.

14. The insulating structure of claim 12, wherein the trench has a depth in the substrate that is greater than 2 μm.

15. The insulating structure of claim 12, wherein the insulating material covering the trench walls includes a plurality of insulating materials.

16. The insulating structure of claim 15, wherein the plurality of insulating materials includes a thermal silicon oxide layer, a silicon oxide layer, and a silicon nitride layer.

17. A semiconductor structure comprising:
   a semiconductor substrate having a surface;
   a plurality of trenches having sidewalls formed in the substrate at the first surface, the plurality of trenches being spaced apart from each other;
   a first layer of insulating material conforming to the sidewalls of a first trench of the plurality of trenches;
   doped polysilicon in the first trench over at least a portion of the first layer of insulating material;
   a silicon oxide plug formed over the polysilicon in the first trench, an upper surface of the silicon oxide plug located above the substrate and a lower surface of the silicon oxide plug being below the first surface of the substrate;
   a second layer of insulating material formed over the silicon oxide plug and
   a conductive gate located between two adjacent trenches.

18. The semiconductor structure of claim 17, wherein the lower surface of the silicon oxide plug is below the surface of the substrate.

19. The semiconductor structure of claim 17, wherein the at least one insulating materials includes a plurality of insulting materials including a thermal silicon oxide layer, a silicon oxide layer, and a silicon nitride layer.

20. The semiconductor structure of claim 17, further comprising insulating material filling a second trench of the plurality of trenches, the first trench having a first depth, the second trench having a second depth that is smaller than the first depth.

21. A method of manufacturing an insulating trench, the method comprising:
   forming a trench having trench walls in a surface of a substrate;
   covering the trench walls with an insulating material;
   filling the trench with doped polysilicon;
   forming a silicon oxide plug over the polysilicon, a first surface of the silicon oxide plug located above the surface of the substrate and a second surface of the silicon oxide plug being substantially at or below the surface of the substrate, the forming of the silicon oxide plug including:
      performing a thermal oxidation to form said oxide plug; or
      depositing silicon oxide over the polysilicon and planarizing the silicon oxide.

22. The method of claim 21, further comprising:
   forming a masking layer on the surface of the substrate; and
   removing the masking layer subsequent to the forming of the silicon oxide plug.

23. A method of manufacturing an insulating trench, the method comprising:
   forming, on a surface of the substrate, a masking structure having a layer of a selectively etchable first material, the first material being silicon nitride;
   forming a trench having trench walls in the first masking structure and the substrate;
   covering the trench walls with an insulating material;
   filling the trench with doped polysilicon; and
   forming a silicon oxide plug over the polysilicon, a first surface of the silicon oxide plug located above the surface of the substrate and a second surface of the silicon oxide plug being substantially at or below the surface of the substrate.

24. The method of claim 23, further comprising removing the masking structure.

25. A method of manufacturing an insulating trench, the method comprising:
   forming a first trench having trench walls in a surface of a substrate;
   covering the trench walls with a first insulating material;
   filling the trench with doped polysilicon; and
   forming a silicon oxide plug over the polysilicon, an upper surface of the silicon oxide plug located above the surface of the substrate and a lower surface of the silicon oxide plug being substantially at or below the surface of the substrate;
   forming a second trench in the surface of the substrate, the second trench having a smaller depth than the first trench;
   depositing a second insulating material to fill the second trench; and
   planarizing the second insulating material to have an upper surface that is coplanar with the upper surface of the silicon oxide plug.

26. The method of claim 25, further comprising forming an insulating layer on the upper surface of the silicon oxide plug.

* * * * *